United States Patent
Hong

(10) Patent No.: US 12,002,502 B2
(45) Date of Patent: Jun. 4, 2024

(54) MEMORY DEVICE AND REFRESH METHOD THEREOF

(71) Applicant: SAMSUNG ELECTRONICS CO., LTD., Suwon-si (KR)

(72) Inventor: Seungki Hong, Incheon (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 152 days.

(21) Appl. No.: 17/882,242

(22) Filed: Aug. 5, 2022

(65) Prior Publication Data
US 2023/0298655 A1    Sep. 21, 2023

(30) Foreign Application Priority Data
Mar. 16, 2022    (KR) .................. 10-2022-0032886

(51) Int. Cl.
*G11C 11/406*    (2006.01)
*G11C 29/00*    (2006.01)

(52) U.S. Cl.
CPC .. *G11C 11/40622* (2013.01); *G11C 11/40615* (2013.01); *G11C 29/783* (2013.01)

(58) Field of Classification Search
CPC ........ G11C 11/40622; G11C 11/40615; G11C 29/783
See application file for complete search history.

(56) References Cited

U.S. PATENT DOCUMENTS

| | | | |
|---|---|---|---|
| 10,446,216 B2 | 10/2019 | Oh et al. | |
| 10,770,127 B2 | 9/2020 | Shore et al. | |
| 11,158,364 B2 | 10/2021 | Penney et al. | |
| 11,908,507 B2 * | 2/2024 | Bang ................. | G11C 11/40615 |
| 2015/0262652 A1 | 9/2015 | Igarashi | |
| 2020/0042423 A1 * | 2/2020 | Mazumder ........ | G11C 11/40611 |
| 2022/0059158 A1 * | 2/2022 | Wu .................... | G11C 11/40603 |
| 2022/0208251 A1 * | 6/2022 | Hong ................ | G11C 11/40603 |
| 2023/0143468 A1 * | 5/2023 | Hong ................... | G11C 11/408 |
| | | | 365/222 |

FOREIGN PATENT DOCUMENTS

JP    2018-128991 A    8/2018

OTHER PUBLICATIONS

US 10,964,374 B2, 03/2021, Jenkinson et al. (withdrawn)

* cited by examiner

*Primary Examiner* — Min Huang
(74) *Attorney, Agent, or Firm* — Sughrue Mion, PLLC

(57) ABSTRACT

A memory device is provided. The memory device includes: a memory cell array including a plurality of rows; and a refresh control circuit including a plurality of registers each configured to store a row address. The refresh control circuit is configured to: determine, based on an incoming row address satisfying a replacement condition, in a first determination, whether to replace a first row address stored in a first register among the plurality of registers with the incoming row address based on a replacement probability; maintain the first row address stored in the first register or replace the first row address stored in the first register with the incoming row address based on a first result of the first determination; and determine, in a second determination, a victim row address to be refreshed based on a second row address stored in a second register among the plurality of registers.

20 Claims, 10 Drawing Sheets

MEMORY DEVICE AND REFRESH METHOD THEREOF

CROSS-REFERENCE TO RELATED APPLICATION

This application claims priority to Korean Patent Application No. 10-2022-0032886, filed in the Korean Intellectual Property Office on Mar. 16, 2022, the disclosure of which is incorporated herein in its entirety by reference.

BACKGROUND

1. Field

The disclosure relates to a memory device and a refresh method thereof.

2. Description of Related Art

A volatile memory device such as a dynamic random-access memory (DRAM) may store data by storing charges to a capacitor of a memory cell, and may read data by determining the charges stored in the capacitor. Because the charges stored in the capacitor leak over time, the memory device may periodically perform a refresh operation.

A memory controller of the memory device may access an address of the memory device randomly, and may access a particular address frequently or intensively. As the density of memory cells in the memory device increases, due to a voltage distribution of a row, the influence of charges in memory cells of adjacent rows may increase. In particular, when a certain row is intensively accessed, due to a voltage of an active state of the certain row, data stored in memory cells of an adjacent row may be changed. This phenomenon is called "rowhammer".

SUMMARY

Some embodiments may provide a memory device or a refresh method for efficiently detecting an intensively accessed row to refresh a row adjacent to the intensively accessed row.

According to an aspect of an embodiment, a memory device includes: a memory cell array including a plurality of rows; and a refresh control circuit including a plurality of registers each configured to store a row address. The refresh control circuit is configured to: determine, based on an incoming row address satisfying a replacement condition, in a first determination, whether to replace a first row address stored in a first register among the plurality of registers with the incoming row address based on a replacement probability; maintain the first row address stored in the first register or replace the first row address stored in the first register with the incoming row address based on a first result of the first determination; and determine, in a second determination, a victim row address to be refreshed based on a second row address stored in a second register among the plurality of registers.

According to an aspect of an embodiment, a memory device includes: a memory cell array including a plurality of rows; and a refresh control circuit including: a plurality of registers each configured to store a row address; a plurality of counters respectively corresponding to the plurality of registers, and each configured to count a number of hits in a corresponding register among the plurality of registers; a first control circuit configured to selectively enable a replacement control signal based on a replacement probability; a second control circuit configured to, based on an incoming row address indicating a hit register among the plurality of registers, store the incoming row address to the hit register, and to, based on each of the plurality of registers storing a row address that does not correspond to the incoming row address and the replacement control signal being enabled, replace a first row address stored in a first register among the plurality of registers with the incoming row address; and a calculator configured to identify a victim row address to be refreshed based on a second row address stored in a second register among the plurality of registers.

According to an aspect of an embodiment, a refresh method, of a memory device including a memory cell array including a plurality of rows and a refresh control circuit including a plurality of registers, includes: receiving an incoming row address; determining whether to replace a first row address stored in a first register among the plurality of registers with the incoming row address; maintaining the first row address stored in the first register or replacing the first row address stored in the first register with the incoming row address based on a result of the determining; determining a victim row address based on a second row address stored in a second register of the plurality of registers; and refreshing a victim row indicated by the victim row address.

BRIEF DESCRIPTION OF THE DRAWINGS

The above and other aspects and features will be more apparent from the following description of example embodiments with reference to the attached drawings, in which.

DETAILED DESCRIPTION

Figure 1:
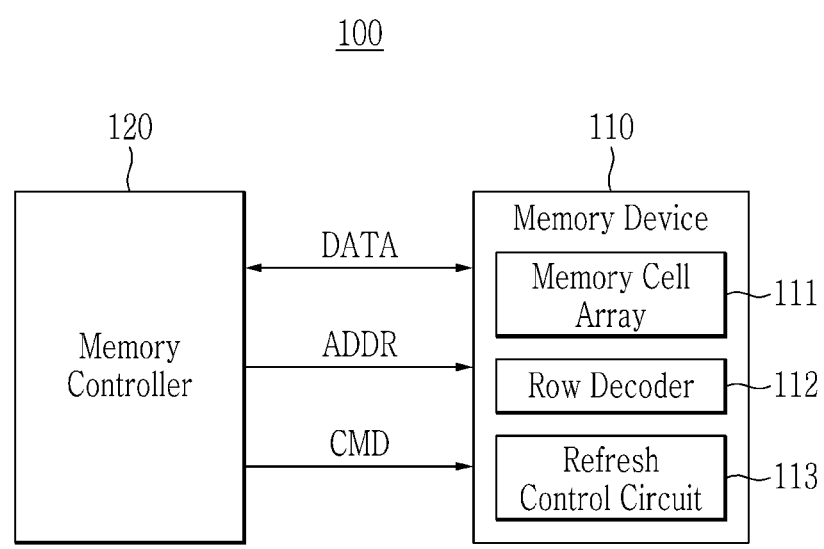
FIG. 1 is an example block diagram of a memory system according to an embodiment.

Example embodiments will now be described with reference to the accompanying drawings. Embodiments described herein are example embodiments, and thus, the present disclosure is not limited thereto, and may be realized in various other forms. Each embodiment provided in the following description is not excluded from being associated with one or more features of another example or another embodiment also provided herein or not provided herein but consistent with the present disclosure.

The drawings and description are to be regarded as illustrative in nature and not restrictive. Like reference numerals indicate like elements throughout the specification. The sequence of operations or steps is not limited to the order presented in the claims or figures unless specifically indicated otherwise. The order of operations or steps may be changed, several operations or steps may be merged, a certain operation or step may be divided, and a specific operation or step may not be performed.

As used herein, the singular forms "a" and "an" are intended to include the plural forms as well, unless the context clearly indicates otherwise. Although the terms first, second, and the like may be used herein to describe various elements, components, steps and/or operations, these terms are only used to distinguish one element, component, step or operation from another element, component, step, or operation. The term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

FIG. 1 is an example block diagram of a memory system according to an embodiment.

Referring to FIG. 1, a memory system 100 may include a memory device 110 and a memory controller 120. In some embodiments, the memory device 110 and the memory controller 120 may be connected through a memory interface to send and receive signals through the memory interface.

The memory device 110 may include a memory cell array 111, a row decoder 112, and a refresh control circuit 113. The memory cell array 111 may include a plurality of memory cells defined by a plurality of rows and a plurality of columns. In some embodiments, the rows may be defined by word lines and the columns may be defined by bit lines. The refresh control circuit 113 may determine a row to be refreshed from among the plurality of rows and transmit an address of the determined row to the row decoder 112. The row decoder 112 may perform a refresh operation on the row to be refreshed. In some embodiments, the row to be refreshed may include a row for controlling a rowhammer.

The memory controller 120 may control a memory operation of the memory device 110 by providing a signal to the memory device 110. The signal may include an instruction CMD and an address ADDR. In some embodiments, the memory controller 120 may provide the instruction CMD and the address ADDR to the memory device 110 to access the memory cell array 111 and control a memory operation such as read or write. Data may be transferred from the memory cell array 111 to the memory controller 120 according to a read operation, and data may be transferred from the memory controller 120 to the memory cell array 111 according to a write operation.

The instruction CMD may include an activate instruction, a read/write instruction, and a refresh instruction. In some embodiments, the instruction CMD may further include a precharge instruction. The activate instruction may be an instruction for switching a target row of the memory cell array 111 to an active state in order to write data to or read data from the target row of the memory cell array 111. A memory cell of the target row may be activated (e.g., driven) in response to the activate instruction. The read/write instruction may be an instruction for performing the read or write operation on the target memory cell of the row switched to the active state. The refresh instruction may be an instruction for performing a refresh operation in the memory cell array 111.

In some embodiments, the memory controller 120 may access the memory device 110 in response to a request from a host external to the memory system 100. The memory controller 120 may communicate with the host using various protocols.

The memory device 110 may be a storage device based on a semiconductor device. In some embodiments, the memory device 110 may include a DRAM device. In some embodiments, the memory device 110 may include other volatile or non-volatile memory devices for which the refresh operation is used.

Figure 2:
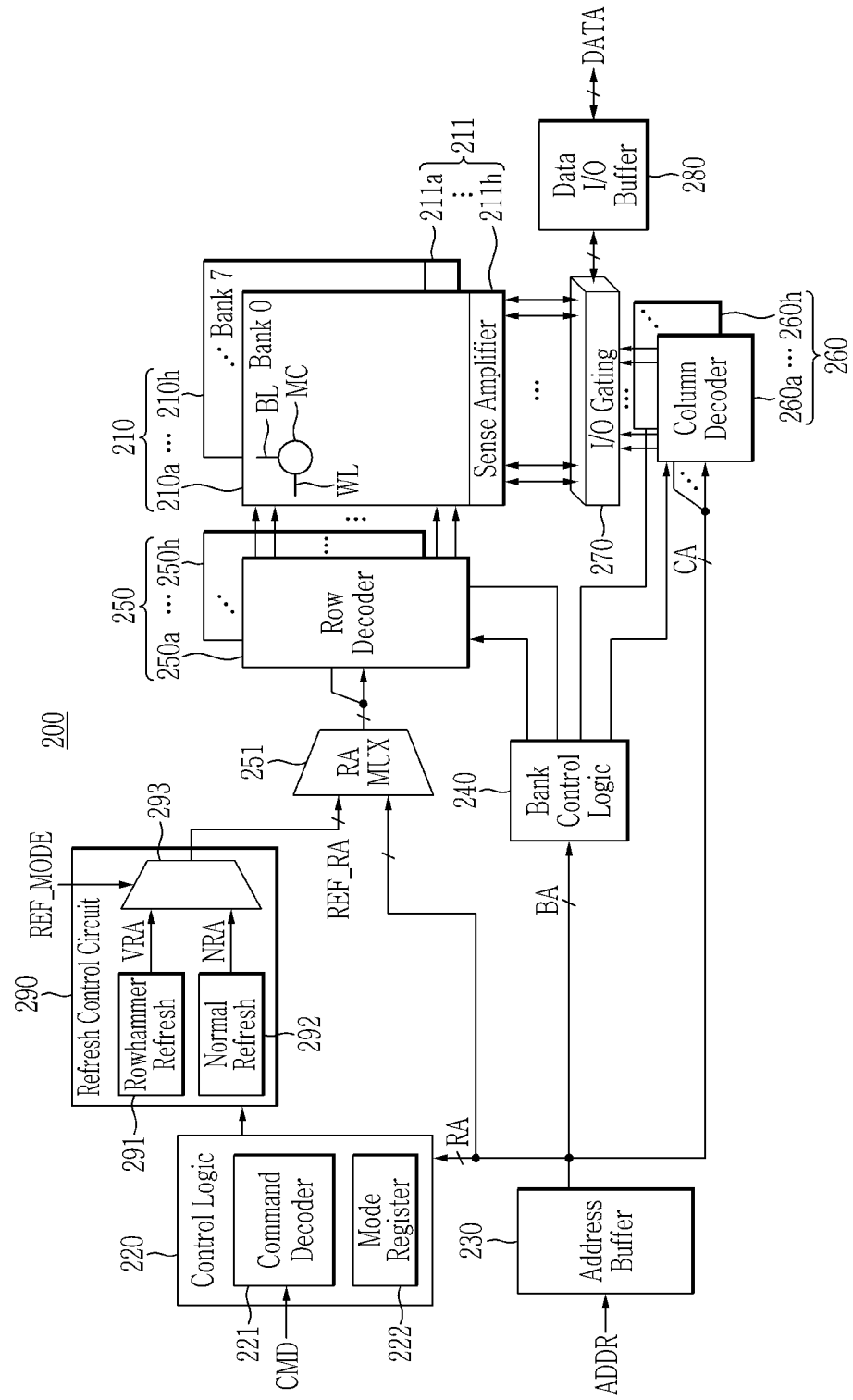
FIG. 2 is an example block diagram showing a memory device according to an embodiment.

FIG. 2 is an example block diagram of a memory device according to an embodiment.

Referring to FIG. 2, a memory device 200 may include a memory cell array 210, a sense amplifier 211, a control logic circuit 220, an address buffer 230, a row decoder 250, a column decoder 260, an input/output (I/O) gating circuit 270, a data I/O buffer 280, and a refresh control circuit 290.

The memory cell array 210 may include a plurality of memory cells MC. In some embodiments, the memory cell array 210 may include a plurality of memory banks 210a to 210h. Although FIG. 2 shows eight memory banks (BANK0 to BANK7) 210a to 210h, the number of memory banks is not limited thereto. Each of the memory banks 210a to 210h may include a plurality of rows, a plurality of columns, and a plurality of memory cells MC arranged at intersections of the plurality of rows and the plurality of columns. In some embodiments, the rows may be defined by a plurality of word lines WL, and the columns may be defined by a plurality of bit lines BL.

The control logic circuit 220 may control an operation of the memory device 200. For example, the control logic circuit 220 may generate a control signal so that the memory device 200 may perform a read operation, a write operation, or a refresh operation. In some embodiments, the control logic circuit 220 may include an instruction decoder 221. The instruction decoder 221 may generate the control signal by decoding an instruction CMD received from a memory controller (e.g., 120 in FIG. 1). In some embodiments, the control logic circuit 220 may further include a mode register 222 that sets an operation mode of the memory device 200.

The address buffer 230 may receive an address ADDR provided by the memory controller 120. The address ADDR may include a row address RA indicating a row of the memory cell array 210 and a column address CA indicating a column of the memory cell array 210. The row address RA may be provided to the row decoder 250, and the column address CA may be provided to the column decoder 260. The row address RA may also be provided to the refresh control circuit 290. In some embodiments, the row address RA may be provided to the row decoder 250 via a row address multiplexer 251. In some embodiments, the address ADDR may further include a bank address BA indicating a memory bank.

In some embodiments, the memory device 200 may further include a row address multiplexer 251. The row address multiplexer 251 may receive the row address RA from the address buffer 230 and a row address REF_RA to be refreshed from the refresh control circuit 290. The row address multiplexer 251 may selectively output the row address RA received from the address buffer 230 and the row address REF_RA received from the refresh control circuit 290 to the row decoder 250.

The row decoder 250 may select a row to be activated from among the plurality of rows of the memory cell array 210 based on the row address RA or REF_RA. The row decoder 250 may apply a driving voltage to a word line corresponding to the row to be activated. In some embodiments, the plurality of row decoders 250a to 250h respectively corresponding to the plurality of memory banks 210a to 210h may be provided.

The column decoder 260 may select a column to be activated from among the plurality of columns of the memory cell array 210 based on the column address CA. The column decoder 260 may activate the sense amplifier 211 corresponding to the column address CA through the I/O gating circuit 270. In some embodiments, the plurality of column decoders 260a to 260h respectively corresponding to the plurality of memory banks 210a to 210h may be provided. In some embodiments, the I/O gating circuit 270 may gate I/O data, and may include a data latch that stores data read from the memory cell array 210 and a write driver that writes data to the memory cell array 210. The data read from the memory cell array 210 may be sensed by the sense amplifier 211 and stored in the I/O gating circuit 270 (e.g., the data latch). In some embodiments, a plurality of sense amplifiers 211a to 211h respectively corresponding to the plurality of memory banks 210a to 210h may be provided.

In some embodiments, the memory device 200 may further include the bank control logic 240 that generates a bank control signal in response to the bank address BA. In response to the bank control signal, a row decoder 250 corresponding to the bank address BA among the row decoders 250a to 250h may be activated, and a column decoder 260 corresponding to the bank address BA among the column decoders 260a to 260h may be activated.

In some embodiments, the data read from the memory cell array 210 (e.g., the data stored in the data latch) may be provided to the memory controller 120 via the data I/O buffer 280. The data to be written to the memory cell array 210 may be provided from the memory controller 120 to the data I/O buffer 280, and the data provided to the data I/O buffer 280 may be provided to the I/O gating circuit 270.

The refresh control circuit 290 may receive the row address RA (i.e., an incoming row address RA), calculate a victim row address VRA based on the row address RA, calculate the refresh row address REF_RA to be refreshed based on the victim row address VRA, and transfer the refresh row address REF_RA to the row decoder 250. The refresh control circuit 290 may include a refresh control circuit 291 that calculates the victim row address VRA. Hereinafter, for convenience of description, the refresh control circuit 291 that calculates the victim row address VRA is referred to as "rowhammer refresh control circuit 291". The refresh control circuit 290 may include a plurality of registers. The rowhammer refresh control circuit 291 may store the incoming row address RA to a corresponding register among the plurality of registers. When the corresponding register does not exist (i.e., when the incoming row address RA does not match a row address stored in the plurality of registers), the rowhammer refresh control circuit 291 may stochastically determine whether to replace a row address stored in an existing register with the incoming row address RA. In some embodiments, the rowhammer refresh control circuit 291 may calculate, based on a minimum count value among count values of the plurality of registers, a probability for determining whether to replace the row address stored in the register having the minimum count value with the incoming row address RA. In some embodiments, the refresh control circuit 290 may further include a normal refresh control circuit 292 that calculates a row address NRA on which a normal refresh operation is to be performed. In some embodiments, the refresh control circuit 290 may further include an address selector 293 that selectively outputs the row address VRA from the rowhammer refresh control circuit 291 or the row address NRA from the normal refresh control circuit 292 in response to a refresh mode REF_MODE. When the refresh mode REF_MODE indicates a normal refresh mode, the refresh row address selector 293 may output the row address NRA from the normal refresh control circuit 292 as the refresh row address REF_RA. When the refresh mode REF_MODE indicates a hammer refresh mode, the refresh row address selector 293 may output the row address VRA from the rowhammer refresh control circuit 291 as the refresh row address REF_RA. In some embodiments, the refresh row address selector 293 may output both the row address VRA from the rowhammer refresh control circuit 291 and the row address NRA from the normal refresh control circuit 292 as the refresh row address REF_RA.

Figure 3:
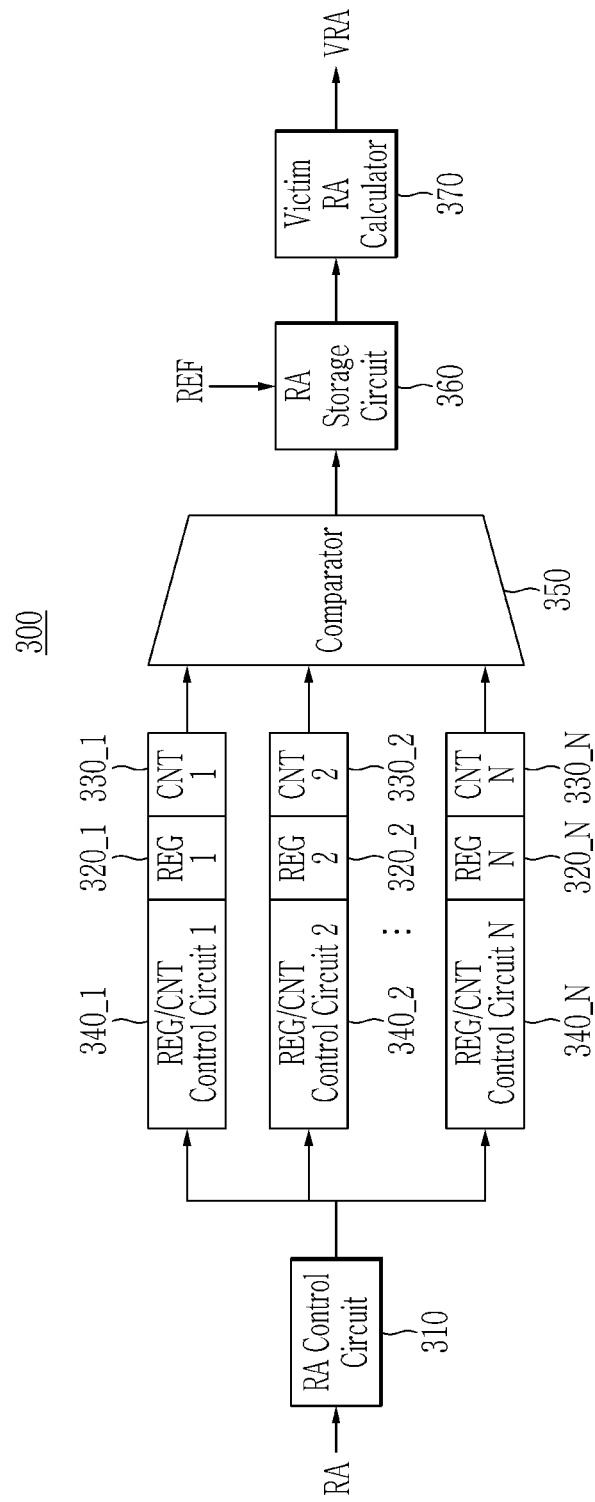
FIG. 3 is an example block diagram showing a refresh control circuit of a memory device according to an embodiment.
Figure 4:
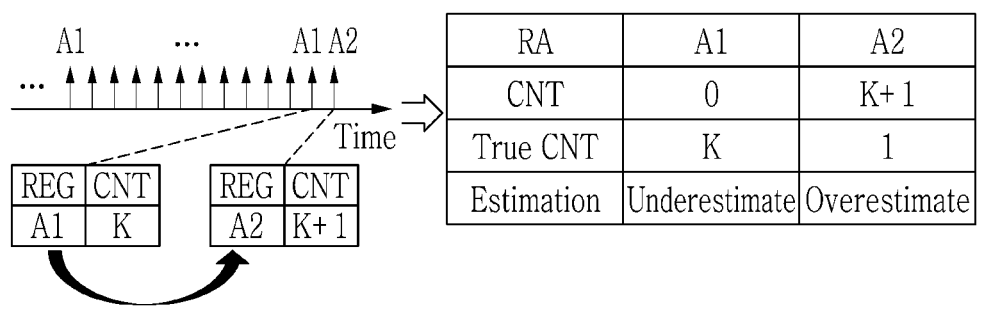
FIG. 4 is an example drawing showing an example operation of a refresh control circuit shown in FIG. 3.

FIG. 3 is an example block diagram showing a refresh control circuit of a memory device according to an embodiment, and FIG. 4 is an example drawing showing an example operation of a refresh control circuit shown in FIG. 3. In some embodiments, a refresh control circuit 300 shown in FIG. 3 may correspond to a rowhammer refresh control circuit.

Referring to FIG. 3, the refresh control circuit 300 may include a row address control circuit 310, a plurality of registers 320_1, 320_2, . . . 320_N, a plurality of counters 330_1, 330_2, . . . 330_N, a plurality of counter/register control circuits 340_1, 340_2, . . . 340_N, a comparator 350, a row address storage circuit 360, and a victim row address calculator 370.

Each of the registers 320_1 to 320_N may store a row address. The plurality of counters 330_1 to 330_N may correspond to the plurality of registers 320_1 to 320_N, respectively, and each of the counters 330_1 to 330_N may count the number of hits for incoming row addresses in a corresponding one of the registers 320_1 to 320_N. The plurality of counter/register control circuits 340_1 to 340_N may correspond to the plurality of registers or counters 320_1 to 320_N or 330_1 to 330_N, respectively. Each of the counter/register control circuit 340_1 to 340_N can control a corresponding register and counter among the registers and counters 320_1 to 320_N and 330_1 to 330_N.

The row address control circuit 310 may receive an incoming row address RA of a row to be activated in a memory cell array (e.g., 111 in FIG. 1). In some embodiments, the incoming row address RA may be transmitted with an activate instruction. The row address control circuit 310 may receive the incoming row address RA and the activate instruction. When there is a register 320_p in which the incoming row address RA hits (i.e., a register 320_p that stores the same row address as the incoming row address RA) among the registers 320_1 to 320_N, the row address control circuit 310 may transfer the incoming row address RA to a counter/register control circuit 340_p corresponding to the register 320_p. Here, p is an integer between 1 and N. The counter/register control circuit 340_p receiving the incoming row address RA may increase a count value of a counter 330_p by a predetermined number (e.g., one). In some embodiments, the counter/register control circuit 340_p may store the incoming row address RA in the corresponding register 320_p again. In some embodiments, the counter/register control circuit 340_p may increase the count value of the counter 330_p without storing the incoming row address RA again in the corresponding register 320_p. When there is no register in which the incoming row address hits but an empty register 320_q exists, the row address control circuit 310 may transfer the incoming row address RA to a counter/register control circuit 340_q corresponding to the empty register 320_q. Here, q is an integer between 1 and N. The counter/register control circuit 340_q receiving the incoming row address may store the incoming row address RA in the register 320_q, and increase a count value of a corresponding counter 330_q by a predetermined number (e.g., one) from an initial value (e.g., zero). When there is no register in which the incoming row address RA hits and there is no empty register, the row address control circuit 310 may transfer the incoming row address RA to a counter/register control circuit 340_i corresponding to a counter 330_i having a minimum count value among the plurality of counters 330_1 to 330_N. Here, i is an integer between 1 and N. The counter/register control circuit 340_i may store the incoming row address RA in a corresponding register 320_i, and increase a count value of the counter 330_i by the predetermined number (e.g., one). In this way, the counter/register control circuit 340_i may replace the row address stored in the register 320_i having the minimum count value with the incoming row address RA.

The comparator 350 may compare count values of the counters 330_1 to 330_N with each other, and detect a row address stored in a register 320_j having a maximum count value. Here, j is an integer between 1 and N. The row address storage circuit 360 may store the row address having the maximum count value detected by the comparator 350 as a detection row address, and the victim row address calculator 370 may calculate a victim row address VRA to be refreshed based on the detection row address. In some embodiments, the row address storage circuit 360 may transfer the detection row address to the victim row address calculator 370 in response to a refresh instruction REF. In some embodiments, the detection row address may be a row address subjected to the rowhammer.

The refresh control circuit 300 may transfer the victim row address VRA to a row decoder (e.g., 250 in FIG. 2). In some embodiments, the memory device may perform a refresh operation on a row indicated by the victim row address in response to the refresh instruction.

According to the above-described embodiments, the refresh control circuit 300 may increase the count value without initializing it when replacing the row address stored in the register 320_i having the minimum count value with the incoming row address. For example, as shown in FIG. 4, it is assumed that the row address stored in the register 320_i is 'A1', and the count value (i.e., minimum count value) of register 320_i is K. When 'A2' is received as the incoming row address, the refresh control circuit 300 may replace the row address 'A1' stored in the register 320_i with 'A2' and increase the count value to (K+1). Next, when the row address 'A1' is received again, the refresh control circuit 300 may replace the row address 'A2' stored in the register 320_i with 'A1' and increase the count value to (K+2). Accordingly, even if the row address stored in the register 320_i is replaced, a situation (e.g., rowhammer) in which the row address 'A1' is intensively accessed can be managed.

However, when the row address 'A2' stored in the register 320_i is not replaced and is maintained, the count value of the row address 'A2' may be overestimated compared with an actual count value because the count value of the row address 'A2' does not start from one but from (K+1). That is, even though no intensive access to the row address 'A2' has occurred, a row address adjacent to the row address 'A2' may be refreshed. Further, because the accumulated count value of the row address 'A1' may be ignored, the count value of the row address 'A1' may be underestimated.

Figure 5:
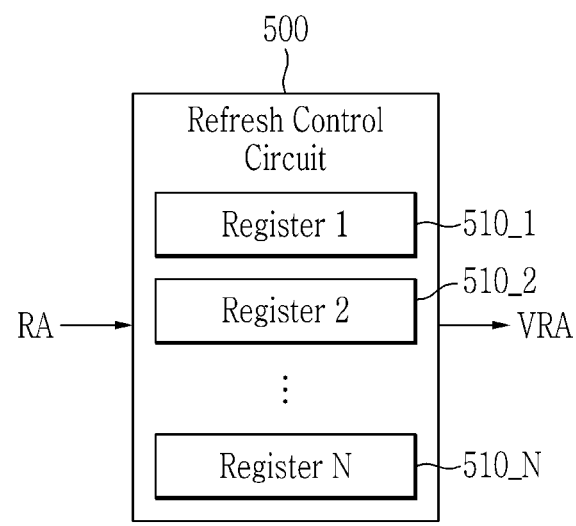
FIG. 5 is an example block diagram showing a refresh control circuit of a memory device according to another embodiment.
Figure 6:
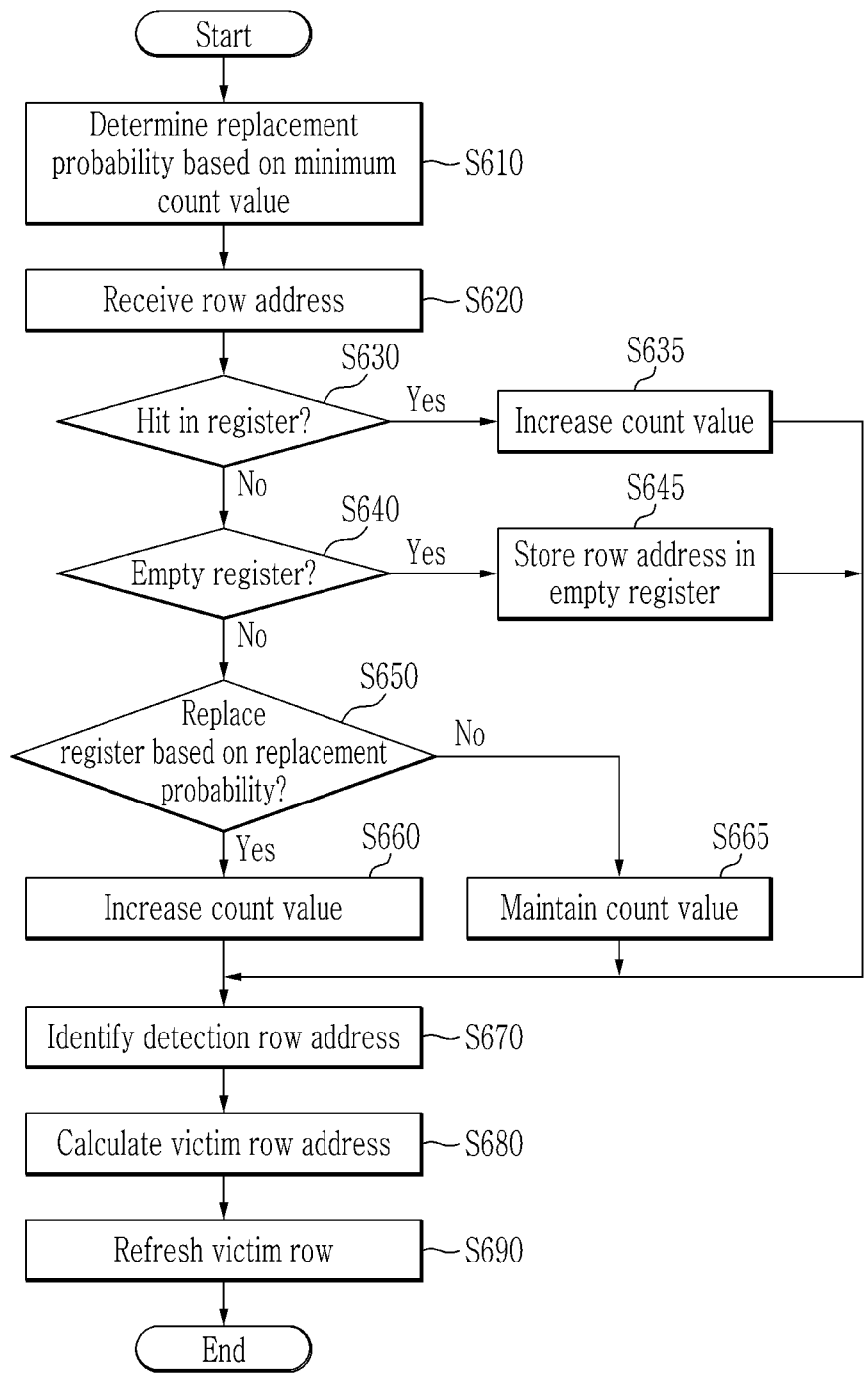
FIG. 6 is an example flowchart showing a refresh method of a memory device according to another embodiment.

FIG. 5 is an example block diagram showing a refresh control circuit of a memory device according to an embodiment, and FIG. 6 is an example flowchart showing a refresh method of a memory device according to an embodiment. In some embodiments, a refresh control circuit 500 shown in FIG. 5 may correspond to a rowhammer refresh control circuit, and a refresh method shown in FIG. 6 may correspond to a rowhammer refresh method.

Referring to FIG. 5, the refresh control circuit 500 may include a plurality of registers 510_1, 510_2, . . . 510_N in which a row address is stored. Referring to FIG. 5 and FIG. 6, a refresh control circuit 500 may determine a replacement probability at S610. The refresh control circuit 500 may receive an incoming row address RA indicating a row to be activated in a memory cell array (e.g., 210 in FIG. 2) at S620.

In some embodiments, the refresh control circuit 500 may determine the replacement probability in response to a predetermined instruction. In some embodiments, the predetermined instruction may include an instruction received before or when an address including the incoming row address RA is transmitted from a memory controller (e.g., 120 in FIG. 1). In some embodiments, the predetermined instruction may be an activate instruction ACT from the memory controller 120.

In some embodiments, the refresh control circuit 500 may determine the replacement probability based on a minimum count value. In some embodiments, the refresh control circuit 500 may determine the replacement probability to be inversely proportional to the minimum count value. In some embodiments, the replacement probability may be set as a reciprocal of a sum of the minimum count value and a predetermined value. In some embodiments, the predetermined value may be a positive value such that the replacement probability has a value less than one. In some embodiments, the predetermined value may be one. In this case, the replacement probability may be determined to be 1/(Min_CNT+1). Here, Min_CNT is the minimum count value.

The refresh control circuit 500 may determine whether the incoming row address RA satisfies a replacement condition at S630 and S640. In some embodiments, the refresh control circuit 500 may determine whether there is a register 510_p, among the registers 510_1 to 510_N, in which the incoming row address RA hits at S630. The register 510_p in which the incoming row address RA hits refers to the register 510_p that stores the same address as the incoming row address RA. When the hit register 510_p exists at S630, the refresh control circuit 500 may increase a count value of the hit register 510_p by a predetermined number (e.g., one) at S635.

In some embodiments, when the hit register does not exist at S630, the refresh control circuit 500 may determine whether there is an empty register 510_q among the registers 510_1 to 510_N at S640. When the empty register 510_q exists at S640, the refresh control circuit 500 may store the incoming row address RA in the empty register 510_q at S645. In this case, the refresh control circuit 500 may increase a count value of the register 510_q by a predetermined number (e.g., one) from an initial value (e.g., zero).

When there is no register in which the incoming row address RA hits and there is no empty register (i.e., when the replacement condition is satisfied) at S630 and S640, the refresh control circuit 500 may stochastically determine whether to replace a row address stored in a register (or a first register) 510_i that satisfies a first condition among the registers 510_1 to 510_N with the incoming row address RA at S650. For example, when the replacement probability is 10%, the row address stored in the register 510_i may be replaced with the incoming row address RA with the probability of 10%. In some embodiments, the register 510_i satisfying the first condition may be the register 510_i having the minimum count value among the registers 510_1 to 510_N.

When the row address stored in the register 510_i is replaced with the incoming row address RA, the refresh control circuit 500 may increase the count value of the register 510_i by the predetermined number (e.g., one) at S660. When the row address stored in the register 510_i is not replaced with the incoming row address RA, the refresh control circuit 500 may maintain the count value of the register 510_i at S665.

The refresh control circuit 500 may detect a row address stored in a register (or a second register) 510_j that satisfies a second condition among the registers 510_1 to 510_N as a detection row address at S670. In some embodiments, the detection row address may be a row address subjected to rowhammer. In some embodiments, the register 510_j satisfying the second condition may be the register 510_j having a maximum count value among the registers 510_1 to 510_N. The refresh control circuit 500 may calculate a victim row address based on the detection row address, and transfer the victim row address to a row decoder (e.g., 250 in FIG. 2) at S680. The victim row address may be a row address (e.g., a target row address of a rowhammer refresh) to be refreshed due to the detection row address. In some embodiments, the victim row address may be transferred to the row decoder 250 through a row address multiplexer (e.g., 251 in FIG. 2). A memory device may refresh a row (hereafter referred to as a "victim row") indicated by the victim row address at S690. In some embodiments, the memory device may refresh the victim row along with a row for a normal refresh. In some embodiments, the memory device may refresh the victim row separately.

In some embodiments, the refresh control circuit 500 may output the detection row address based on a predetermined condition, and calculate the victim row address based on the detection row address. In some embodiments, the predetermined condition may include a condition that a predetermined instruction is received from the memory controller 120. In some embodiments, the predetermined instruction may include a refresh instruction that instructs a refresh. Accordingly, when the predetermined instruction is received, the refresh control circuit 500 may output the detection row address and calculate the victim row address based on the detection row address. In some embodiments, the predetermined condition may include a predetermined period. In some embodiments, the predetermined period may be a period set for refresh. Accordingly, the refresh control circuit 500 may output the detection row address and calculate the victim row address based on the detection row address, at every predetermined period. In some embodiments, the predetermined condition may include a condition that the maximum count value, i.e., the count value of the detection row address exceeds a threshold. When the count value of the detection row address exceeds the threshold, the refresh control circuit 500 may output the detection row address and calculate the victim row address based on the detection row address.

In some embodiments, the refresh control circuit 500 may determine a row address of a row (victim row) adjacent to a row (hereinafter referred to as "detection row") indicated by the detection row address as the victim row address. In some embodiments, the victim row may include a predetermined number of rows physically adjacent to the detection row. For example, when the detection row is the $m^{th}$ row and the predetermined number is two, the victim row may include the (m+1)th row and the $(m-1)^{th}$ row. Alternatively, when the detection row is the $m^{th}$ row and the predetermined number is four, the victim row may include the (m+2)th row, the (m+1)th row, the $(m-1)^{th}$ row, and $(m-2)^{th}$ row.

Figure 7:
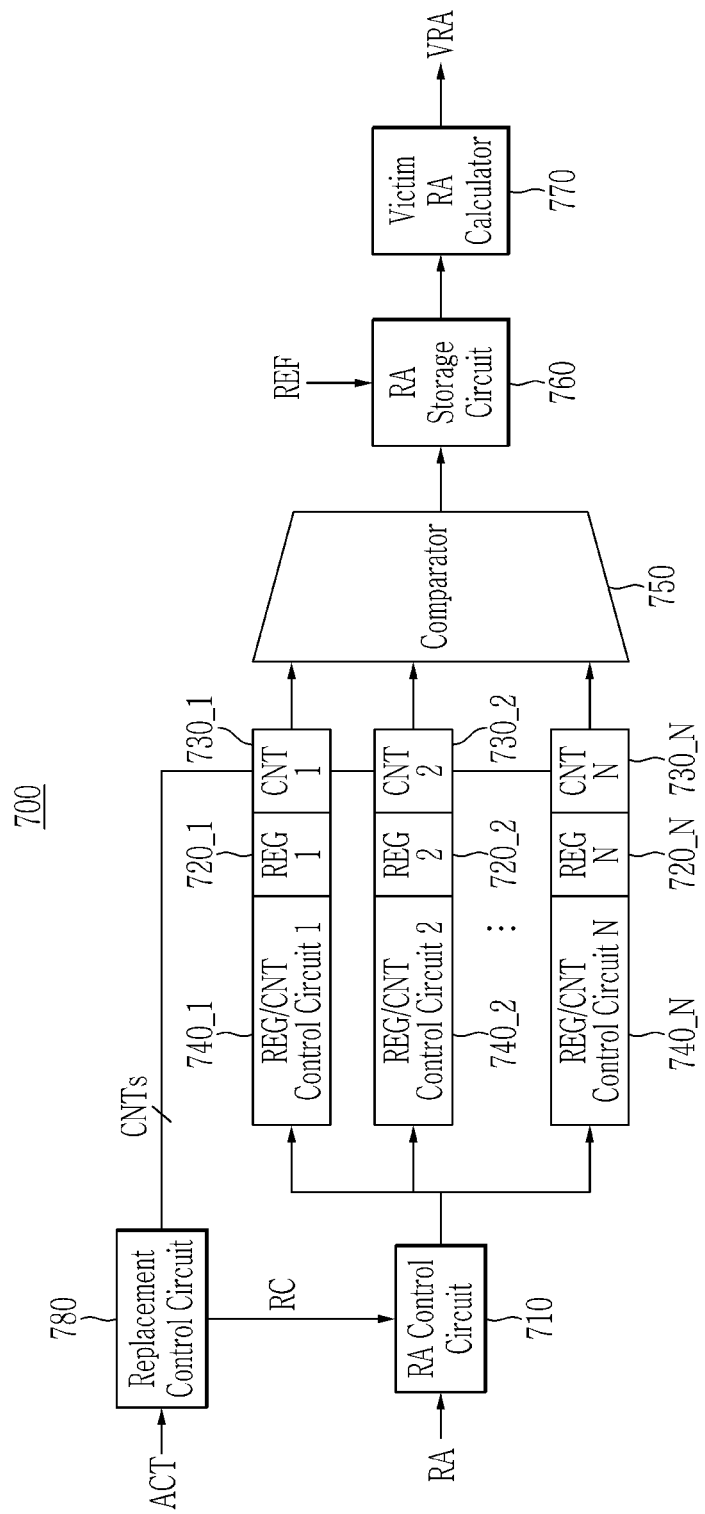
FIG. 7 is another example block diagram showing a refresh control circuit of a memory device according to yet another embodiment.
Figure 8:
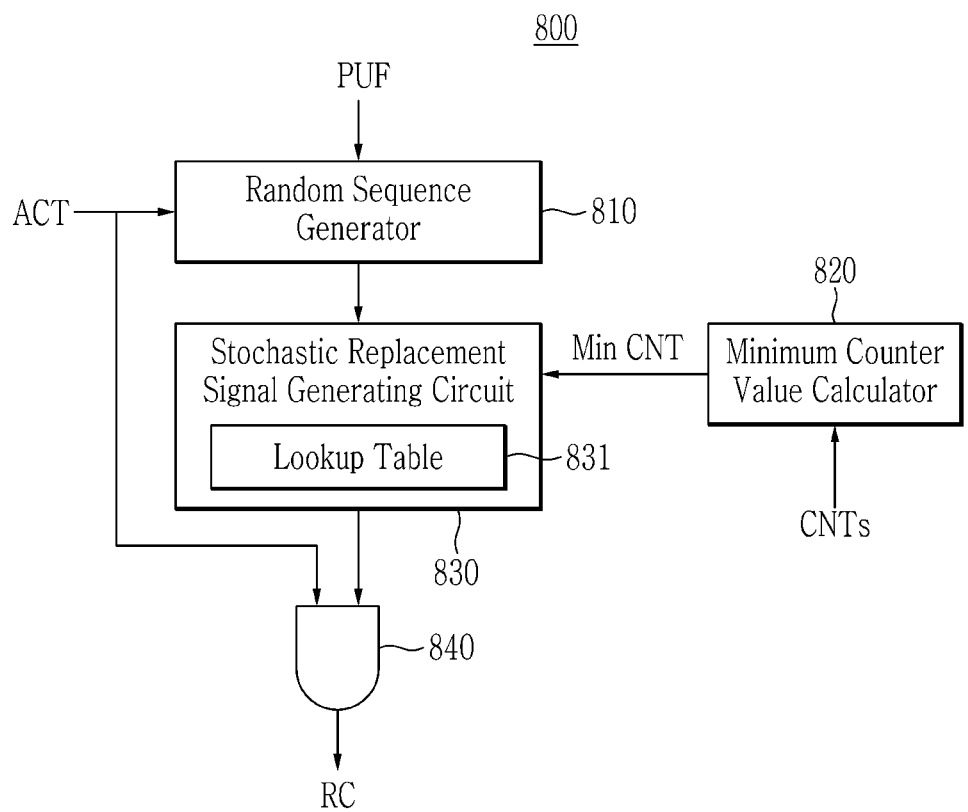
FIG. 8 is an example block diagram showing a replacement control circuit in a refresh control circuit of a memory device according to yet another embodiment.

FIG. 7 is an example block diagram showing a refresh control circuit of a memory device according to an embodiment, and FIG. 8 is an example block diagram showing a replacement control circuit in a refresh control circuit of a memory device according to an embodiment. In some embodiments, a refresh control circuit 700 shown in FIG. 7 and FIG. 8 may correspond to a rowhammer refresh control circuit.

Referring to FIG. 7, a refresh control circuit 700 may include a row address control circuit 710, a plurality of registers 720_1, 720_2, . . . 720_N, a plurality of counters 730_1, 730_2, . . . 730_N, a comparator 750, a row address storage circuit 760, a victim row address calculator 770, and a replacement control circuit 780.

Each of the registers 720_1 to 720_N may store a row address. The plurality of counters 730_1 to 730_N may correspond to the plurality of registers 720_1 to 720_N, respectively, and each of the counters 730_1 to 730_N may count the number of hits for incoming row addresses in a corresponding one of the registers 720_1 to 720_N. In some embodiments, the refresh control circuit 700 may further include a plurality of counter/register control circuits 740_1 to 740_N corresponding to the plurality of registers or counters 720_1 to 720_N or 730_1 to 730_N, respectively. Each of the counter/register control circuits 740_1 to 740_N may control the corresponding register and counter among the registers 720_1 to 720_N and the counters 730_1 to 730_N. In some embodiments, the row address control circuit 710 may control the registers 720_1 to 720_N and the counters 730_1 to 730_N without using the counter/register control circuits 740_1 to 740_N.

Because the registers 720_1 to 720_N, the counters 730_1 to 730_N, the counter/register control circuits 740_1 to 740_N, the comparator 750, the row address storage circuit 760, and the victim row address calculator 770 may perform similar operations to the registers 320_1 to 320_N, the counters 330_1 to 330_N, the counter/register control circuits 340_1 to 340_N, the comparator 350, the row address storage circuit 360, and the victim row address calculator 370 described with reference to FIG. 3, detailed descriptions thereof are omitted.

The replacement control circuit 780 may receive count values from the counters 730_1 to 730_N, and determine a replacement probability based on a minimum count value in the counters 730_1 to 730_N. The replacement control circuit 780 may stochastically determine whether to replace a row address stored in the register based on the replacement probability, and enable a replacement control signal RC when it is determined to replace the row address. The replacement control circuit 780 may stochastically determine whether to enable the replacement control signal RC based on the replacement probability. The replacement probability may correspond to a probability with which the replacement control signal RC is enabled. In some embodiments, the replacement control signal RC may have an enable level (e.g., high level) when the replacement control signal RC is enabled, and may have a disable level (e.g., low level) when the replacement control signal RC is disabled. In some embodiments, in response to a predetermined instruction (e.g., an activate instruction ACT), the replacement control circuit 780 may determine the replacement probability and determine whether to enable the replacement control signal RC.

The row address control circuit 710 may receive the incoming row address RA and the replacement control signal RC, and when a replacement condition is satisfied, may determine whether to replace the row address based on the replacement control signal RC being enabled. In some embodiments, the replacement condition may include a condition that there is no register in which the incoming row address RA hits among the registers 720_1 to 720_N. In some embodiments, the replacement condition may further include a condition that there is no empty register among the registers 720_1 to 720_N when the register in which the incoming row address RA hits does not exist.

When there is a register 720_p in which the incoming row address RA hits among the registers 720_1 to 720_N, the row address control circuit 710 may transfer the incoming row address RA to a counter/register control circuit 740_p corresponding to the register 720_p. When there is no register in which the incoming row address RA hits but an empty register 720_q exists, the row address control circuit 710 may transfer the incoming row address RA to a counter/register control circuit 740_q corresponding to the empty register 720_q.

When there is no register in which the incoming row address RA hits and there is no empty register, the row address control circuit 710 may determine whether to perform the replacement based on the replacement control signal RC. When the replacement control signal RC is enabled (e.g., when the replacement control signal RC has the enable level), the row address control circuit 710 may transfer the incoming row address RA to a counter/register control circuit 740_i corresponding to a counter 730_i having the minimum count value among the counters 730_1 to 730_N. The counter/register control circuit 740_i may store the incoming row address RA in the corresponding register 720_i, and increase a count value by the predetermined number (e.g., one). As such, when the replacement control signal is enabled, the counter/register control circuit 740_i may replace the row address stored in the register 720_i having the minimum count value with the incoming row address RA. On the other hand, when the replacement control signal RC is disabled (e.g., when the replacement control signal RC has the disabled level), the row address control circuit 710 may not transfer the incoming row address RA to the counter/register control circuit 740_i. As such, when the replacement control signal RC is disabled, the counter/register control circuit 740_i may not replace the row address stored in the register 720 having the minimum count value with the incoming row address RA.

The comparator 750 may compare the count values of the counters 730_1 to 730_N with each other, and detect a row address stored in a register 720_j having a maximum count value. The row address storage circuit 760 may store the row address having the maximum count value determined by the comparator 750 as a detection row address, and the victim row address calculator 770 may calculate a victim row address based on the detection row address. Accordingly, a memory device may refresh a victim row indicated by the victim row address. In some embodiments, the row address storage circuit 760 may output the detection row address based on a predetermined condition. In some embodiments, the row address storage circuit 760 may include a latch that outputs the stored detection row address in response to a predetermined instruction (e.g., a refresh instruction REF).

In some embodiments, the memory device may initialize the registers 720_1 to 720_N and the counters 730_1 to 730_N after refreshing the victim row.

Referring to FIG. 8, a replacement control circuit 800 may include a random sequence generator 810, a minimum count value calculator 820, and a stochastic replacement signal generating circuit 830, each of which may be implemented using circuitry such as transistors, capacitors, logic gates, and other circuit elements to implement certain functionality described in more detail below. In some embodiments, the replacement control circuit 800 shown in FIG. 8 may correspond to the replacement control circuit 780 shown in FIG. 7.

The random sequence generator 810 may generate a random sequence. The random sequence may include a random number or a pseudorandom number. In some embodiments, the random sequence generator 810 may include a pseudorandom number generator (PRNG). In some embodiments, the random sequence generator 810 may generate the random sequence in response to a predetermined instruction from a memory controller (e.g., 120 in FIG. 1). In some embodiments, the predetermined instruction may be an activate instruction ACT. In some embodiments, the random sequence generator 810 may generate the random sequence using a unique identification information as an initial value (e.g., a seed). In some embodiments, the unique identification information may be unique identification information of a memory device, for example, a physically unclonable function (PUF).

The minimum count value calculator 820 may receive count values from a plurality of counters (e.g., 730_1 to 730_N in FIG. 7), and may calculate a minimum count value among the count values of the counters 730_1 to 730_N.

The stochastic replacement signal generating circuit 830 may generate a stochastic replacement signal based on the random sequence from the random sequence generator 810 and the minimum count value from the minimum count value calculator 820. In some embodiments, the stochastic replacement signal generating circuit 830 may select, as a replacement probability, a probability corresponding to the minimum count value from among a plurality of probabilities respectively corresponding to a plurality of count values. In some embodiments, the plurality of probabilities may be given as a plurality of lookup table 831, respectively. Each of the lookup tables 831 may use a probability determined by the minimum count value associated with itself. For example, each of the lookup table 831 may store a range of random sequences associated with enable and a range of random sequences associated with disable. The range of the random sequences associated with the enable, and the range of the random sequences associated with the disable may be determined based on a probability associated with the corresponding lookup table 831. The stochastic replacement signal generating circuit 830 may select a lookup table 831 corresponding to the minimum count value from among the plurality of lookup tables 831, and input a random sequence to the selected lookup table 831 to determine the enable of the replacement signal. For example, when the minimum count value is CNT, the lookup table 831 using the probability of 1/(CNT+1) is selected, so the stochastic replacement signal generating circuit 830 may enable the replacement signal with a probability of 1/(CNT+1). In some embodiments, the replacement signal may have an enable level (e.g., high level) when the replacement signal is enabled, and may have a disable level (e.g., low level) when the replacement signal is disabled.

In some embodiments, the replacement control circuit 800 may output the replacement signal generated by the stochastic replacement signal generating circuit 830 as a replacement control signal RC. In some embodiments, the replacement control circuit 800 may further include a logic circuit 840. The logic circuit 840 may perform a logical operation on a predetermined instruction (e.g., an activate instruction ACT) and the replacement signal to output the replacement control signal RC. For example, when the enable level of the replacement signal is the high level, the logic circuit 840 may include an AND circuit that performs an AND operation on the replacement signal and the predetermined instruction to output the replacement control signal RC with the high level (enable level) when the replacement signal and the predetermined instruction both have the high level.

According to the above-described embodiments, the refresh control circuit can stochastically replace the row address stored in the register having the minimum count value with the incoming row address. In this case, the higher the minimum count value, the lower the probability of being replaced with the incoming row address, so that a possibility that the row address stored in the register is underestimated can be reduced. An example operation according to the above-described embodiments is described below with reference to FIG. 9, FIG. 10A, FIG. 10B, FIG. 10C, and FIG. 10D.

Figure 9:
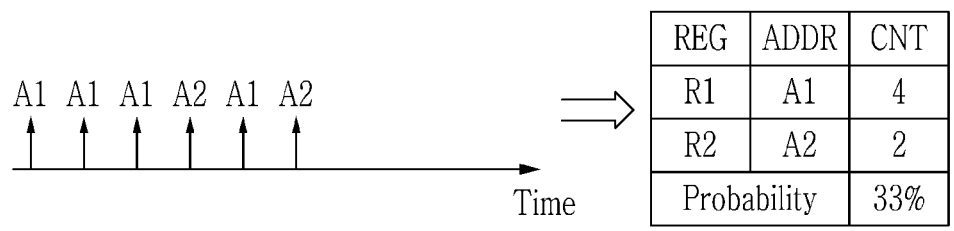
FIGS. 9, 10A, 10B, 10C, and 10D are example drawings showing example operations of a refresh control circuit.

For example, as shown in FIG. 9, it is assumed that two registers R1 and R2 are included in a refresh control circuit, a row address stored in the register R1 is 'A1', a count value of 'A1' is four, a row address stored in the register R2 is 'A2', and a count value of 'A2' is two. Further, it is assumed that a replacement probability is a reciprocal of a sum of a minimum count value and one. Furthermore, in FIGS. 10A, 10B, 10C, and 10D, a case where replacement occurs in the register is shown as "R" and a case where the replacement does not occur is shown as "N".

Figure 10A:
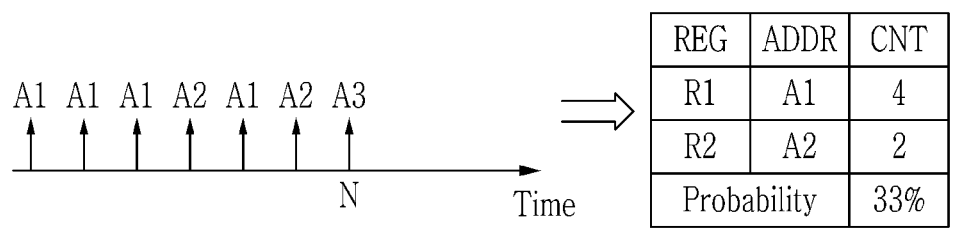
Figure 10B:
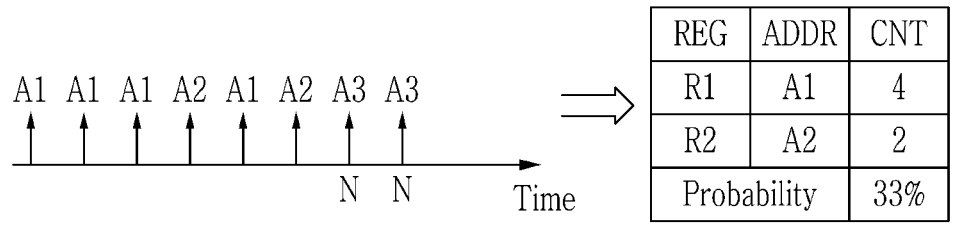
Figure 10C:
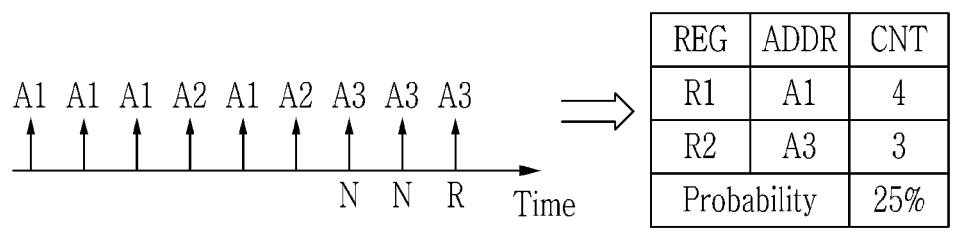

When a new row address 'A3' is received, there is a probability of 1/3 (i.e., a reciprocal of a sum of the minimum count value, 2, and 1, approximately 33%) the refresh control circuit will replace the existing row address 'A2' with the new row address 'A3' because the minimum count value is two. For example, as shown in FIG. 10A, when 'A3' is received, the row address stored in the register R2 having the minimum count value may be replaced with 'A3' with the probability of 33%. It is shown in FIG. 10A that the row address stored in the register R2 is not replaced with 'A3', so the register R2 continues to store 'A2' and the count value maintains two. Next, as shown in FIG. 10B, when 'A3' is received again, the row address stored in the register R2 may be replaced with 'A3' with the probability of 33%. It is shown in FIG. 10B that the row address stored in the register R2 is not replaced with 'A3', so the register R2 continues to store 'A2' and the count value maintains two. As shown in FIG. 10C, when 'A3' is received again, there is again a 33% probability the row address stored in the register R2 may be replaced with 'A3'. It is shown in FIG. 10C, that the row address stored in the register R2 is replaced with 'A3', and the count value is increased to three. Then, when a new row address is received next, the probability with which the row address stored in the register R2 is replaced is changed to 1/4 (i.e., a reciprocal of a sum of the minimum count value, 3, and 1, =25%).

Figure 10D:
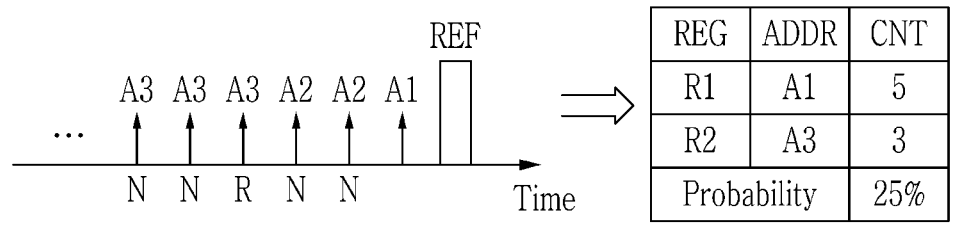

As shown in FIG. 10D, when 'A2' is received as a new row address after the row address stored in the register R2 is replaced with 'A3', the row address stored in the register R2 having the minimum count value may be replaced with 'A2' with the probability of 25%. It is shown in FIG. 10D that 'A2' is received twice in succession but the row address stored in the register R2 is not replaced, so the register R2 continues to store 'A3' and the count value is maintained. Next, when 'A1' is received as a new row address, 'A1' hits in the register R1, so the count value of the register R1 is increased to five. When a refresh instruction REF is received, a memory device may calculate a victim row address based on the row address 'A1' stored in the register R1 having a maximum count value and refresh a victim row. Further, the memory device may initialize the registers R1 and R2 and their count values.

As described above, when the new row address is received, the row address stored in the register may not always be replaced with the new row address, but may be stochastically replaced. As shown in FIG. 10A, when the new row address 'A3' is received only once, it is unlikely that the row address stored in the register R2 is replaced with 'A3'. However, as shown in FIG. 10C, when the new row address 'A3' is intensively received, the possibility that the row address stored in the register R2 is replaced with 'A3' may increase. As such, when the new row address is rarely received, it is unlikely that the existing row address can be replaced with the new row address. Accordingly, it can prevent the count value of the existing row address from being underestimated or the count value of the new row address from being overestimated. On the other hand, when the new row address is intensively received, the existing row address can be highly likely to be replaced with the new row address. Accordingly, the row address which is intensively received can be counted.

In addition, as shown in FIG. 10A to FIG. 10C, the probability of replacing 'A2' stored in the register R2 may be 33% when the count value of 'A2' is two, whereas the probability of replacing 'A2' stored in the register R2 may be 10% when the count value of 'A2' is nine. As such, because the replacement probability is inversely proportional to the count value, the larger the count value of the existing row address stored in the register, the lower the probability of being replaced with the new row address. Because the row address with the large count value is a row address which is intensively received, the possibility of continuously tracking the count value of the intensively-received row address may increase.

Figure 11:
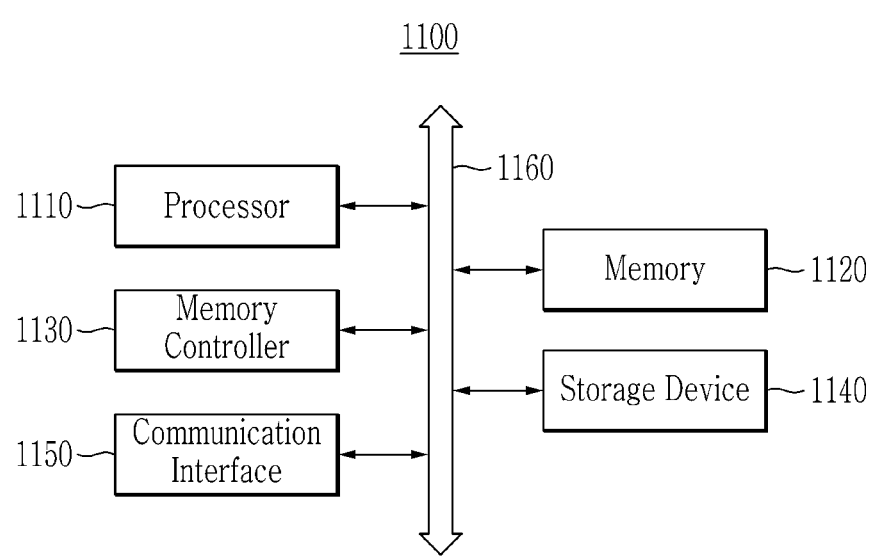
FIG. 11 is an example block diagram showing a computer system according to an embodiment.

FIG. 11 is an example block diagram showing a computer system according to an embodiment.

Referring to FIG. 11, a computing system 1100 may include a processor 1110, a memory 1120, a memory controller 1130, a storage device 1140, a communication interface 1150, and a bus 1160. The computing system 1100 may further include other components.

The processor 1110 may control an overall operation of each component of the computing system 1100. The processor 1110 may be implemented with at least one of various processing units (i.e., hardware components) such as a central processing unit (CPU), an application processor (AP), and a graphic processing unit (GPU).

The memory 1120 may store various data and instructions. The memory 1120 may be implemented with the memory device described with reference to FIG. 1 to FIG. 10D. The memory controller 1130 may control transfers of the data or instructions to and from the memory 1120. The memory controller 1130 may be implemented with the memory controller described with reference to FIG. 1 to FIG. 10D. In some embodiments, the memory controller 1130 may be provided as a separate chip from the processor 1110. In some embodiments, the memory controller 1130 may be provided as an internal component of the processor 1110.

The storage device 1140 may non-temporarily store programs and data. In some embodiments, the storage device 1140 may be implemented as a non-volatile memory. The communication interface 1150 may support wired or wireless Internet communication of the computing system 1100. In addition, the communication interface 1150 may support various communication methods other than Internet communication. The bus 1160 may provide a communication function between the components of the computing system 1100. The bus 1160 may include at least one type of bus according to a communication protocol between the components.

In some embodiments, each of the components, elements, modules or units represented by a block as illustrated in FIG. 1 to FIG. 10D may be implemented as various numbers of hardware, software and/or firmware structures that execute respective functions described above, according to example embodiments. For example, at least one of these components, elements, modules or units may include various hardware components including a digital circuit, a programmable or non-programmable logic device or array, an application specific integrated circuit (ASIC), or other circuitry using use a direct circuit structure, such as a memory, a processor, a logic circuit, a look-up table, etc., that may execute the respective functions through controls of one or more microprocessors or other control apparatuses. Also, at least one of these components, elements, modules or units may include a module, a program, or a part of code, which contains one or more executable instructions for performing specified logic functions, and executed by one or more microprocessors or other control apparatuses. Also, at least one of these components, elements, modules or units may further include or may be implemented by a processor such as a central processing unit (CPU) that performs the respective functions, a microprocessor, or the like. Functional aspects of example embodiments may be implemented in algorithms that execute on one or more processors. Furthermore, the components, elements, modules or units represented by a block or processing steps may employ any number of related art techniques for electronics configuration, signal processing and/or control, data processing and the like.

While aspects of example embodiments have been particularly shown and described, it will be understood that various changes in form and details may be made therein without departing from the spirit and scope of the following claims.

Each of the embodiments provided in the above description is not excluded from being associated with one or more features of another example or another embodiment also provided herein or not provided herein but consistent with the inventive concept. For example, even if matters described in a refresh control circuit of an embodiment, are not described in a reference control circuit of another embodiment, the matters may be understood as being related to or combinable with the different example or embodiment, unless otherwise mentioned in descriptions thereof. In addition, it should be understood that all descriptions of principles, aspects, examples, and specific embodiments of the inventive concept are intended to encompass structural and functional equivalents thereof. In addition, these equivalents should be understood as including not only currently well-known equivalents but also equivalents to be developed in the future, that is, all devices invented to perform the same functions regardless of the structures thereof.

What is claimed is:

1. A memory device comprising:
    a memory cell array comprising a plurality of rows; and
    a refresh control circuit comprising a plurality of registers each configured to store a row address,
    wherein the refresh control circuit is configured to:
        determine, based on an incoming row address satisfying a replacement condition, in a first determination, whether to replace a first row address stored in a first register among the plurality of registers with the incoming row address based on a replacement probability;
        maintain the first row address stored in the first register or replace the first row address stored in the first register with the incoming row address based on a first result of the first determination; and
        determine, in a second determination, a victim row address to be refreshed based on a second row address stored in a second register among the plurality of registers.

2. The memory device of claim 1, wherein the refresh control circuit is further configured to:
    count a number of hits in each of the plurality of registers; and
    determine the replacement probability based on a minimum count value among a plurality of count values of the plurality of registers.

3. The memory device of claim 2, wherein the refresh control circuit further is configured to determine the replacement probability to be inversely proportional to the minimum count value.

4. The memory device of claim 2, wherein the refresh control circuit is further configured to identify the replacement probability as a reciprocal of a sum of the minimum count value and a positive value.

5. The memory device of claim 2, wherein the refresh control circuit is further configured to select, as the replacement probability, a probability corresponding to the minimum count value from among the plurality of count values.

6. The memory device of claim 5, wherein the refresh control circuit is further configured to:
    generate a random sequence based on unique identification information of the memory device;
    selectively enable a replacement control signal based on the random sequence and the replacement probability; and
    replace the first row address stored in the first register with the incoming row address based on the replacement control signal being enabled.

7. The memory device of claim 6, wherein the unique identification information comprises a physically unclonable function (PUF).

8. The memory device of claim 2, wherein the first register is a register having the minimum count value among the plurality of registers.

9. The memory device of claim 2, wherein the second register is a register having a maximum count value among the plurality of registers.

10. The memory device of claim 1, wherein the refresh control circuit is further configured to:
    selectively enable a replacement control signal based on the replacement probability; and
    replace the first row address stored in the first register with the incoming row address based on the replacement control signal being enabled.

11. The memory device of claim 1, wherein the refresh control circuit is further configured to increase a count value of the first register based on the first row address stored in the first register being replaced with the incoming row address according to the first determination.

12. The memory device of claim 1, wherein the refresh control circuit is further configured to maintain a count value of the first register based on the first row address stored in the first register being maintained according to the first determination.

13. The memory device of claim 1, wherein the replacement condition comprises a first condition that the incoming row address is different from the row address stored in each of the plurality of registers.

14. The memory device of claim 13, wherein the replacement condition further comprises a second condition that the plurality of registers does not comprise an empty register.

15. The memory device of claim 1, wherein the victim row address is adjacent to the second row address.

16. A memory device comprising:
a memory cell array comprising a plurality of rows; and
a refresh control circuit comprising:
  a plurality of registers each configured to store a row address;
  a plurality of counters respectively corresponding to the plurality of registers, and each configured to count a number of hits in a corresponding register among the plurality of registers;
  a first control circuit configured to selectively enable a replacement control signal based on a replacement probability;
  a second control circuit configured to, based on an incoming row address indicating a hit register among the plurality of registers, store the incoming row address to the hit register, and to, based on each of the plurality of registers storing a row address that does not correspond to the incoming row address and the replacement control signal being enabled, replace a first row address stored in a first register among the plurality of registers with the incoming row address; and
  a calculator configured to identify a victim row address to be refreshed based on a second row address stored in a second register among the plurality of registers.

17. The memory device of claim 16, wherein the first control circuit is further configured to determine the replacement probability based on a minimum count value among count values of the plurality of counters.

18. The memory device of claim 17, wherein the first control circuit is further configured to determine the replacement probability to be inversely proportional to the minimum count value.

19. The memory device of claim 16, wherein the second control circuit is further configured to, based on the first row address stored in the first register being replaced with the incoming row address, increase a count value of a first counter corresponding to the first register among the plurality of counters.

20. A refresh method of a memory device including a memory cell array including a plurality of rows and a refresh control circuit including a plurality of registers, the refresh method comprising:
receiving an incoming row address;
determining whether to replace a first row address stored in a first register among the plurality of registers with the incoming row address;
maintaining the first row address stored in the first register or replacing the first row address stored in the first register with the incoming row address based on a result of the determining;
determining a victim row address based on a second row address stored in a second register of the plurality of registers; and
refreshing a victim row indicated by the victim row address.

* * * * *